(12) United States Patent
Chen et al.

(10) Patent No.: US 10,581,011 B2
(45) Date of Patent: Mar. 3, 2020

(54) LIGHT EMITTING DEVICE WITH DIFFERENT LIGHT EMITTING MATERIAL OVERLAPPING WIDTH

(71) Applicant: INT TECH CO., LTD., Hsinchu County (TW)

(72) Inventors: Huei-Siou Chen, Taipei (TW); Li-Chen Wei, Taichung (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 15/995,472

(22) Filed: Jun. 1, 2018

(65) Prior Publication Data

US 2019/0372047 A1   Dec. 5, 2019

(51) Int. Cl.
| | |
|---|---|
| *H01L 51/50* | (2006.01) |
| *H01L 27/32* | (2006.01) |
| *H01L 51/00* | (2006.01) |
| *H01L 51/52* | (2006.01) |
| H01L 27/15 | (2006.01) |

(52) U.S. Cl.
CPC ...... *H01L 51/5044* (2013.01); *H01L 27/3206* (2013.01); *H01L 27/3295* (2013.01); *H01L 51/0096* (2013.01); *H01L 51/5206* (2013.01); *H01L 27/156* (2013.01)

(58) Field of Classification Search
None
See application file for complete search history.

(56) References Cited

U.S. PATENT DOCUMENTS

| | | | | |
|---|---|---|---|---|
| 7,012,367 B2* | 3/2006 | Seki | ............. | H01L 27/3246 257/72 |
| 7,199,516 B2* | 4/2007 | Seo | ............. | H01L 27/3246 313/504 |
| 7,355,342 B2* | 4/2008 | Hayashi | ............. | H01L 27/3246 313/500 |
| 7,683,537 B2* | 3/2010 | Yoshida | ............. | H01L 27/3246 313/292 |

(Continued)

FOREIGN PATENT DOCUMENTS

| | | |
|---|---|---|
| CN | 101543135 A | 9/2009 |
| CN | 102612858 A | 7/2012 |

(Continued)

OTHER PUBLICATIONS

Search Report dated Apr. 30, 2019 issued by the European Patent Office for counterpart application No. 18198895.7.

(Continued)

*Primary Examiner* — Andres Munoz
(74) *Attorney, Agent, or Firm* — WPAT, P.C., Intellectual Property Attorneys; Anthony King

(57) ABSTRACT

A light emitting device includes a substrate and a light emitting layer over the substrate, the light emitting layer. The light emitting layer has a light emitting pixel array including a plurality of light emitting pixels and a spacer. The spacer is configured to separating the plurality of light emitting pixels. Each light emitting pixel has a light emitting material and an electrode between the light emitting material and the substrate. The spacer has a bump having a curved surface extruding away from the substrate, and the bump covers a peripheral region of the electrode.

18 Claims, 13 Drawing Sheets

(56) References Cited

U.S. PATENT DOCUMENTS

| | | | |
|---|---|---|---|
| 7,764,013 B2* | 7/2010 | Lee | C09D 11/30 313/506 |
| 7,781,956 B2* | 8/2010 | Takagi | H01L 27/3246 313/498 |
| 7,781,963 B2* | 8/2010 | Yoshida | H01L 27/3246 313/504 |
| 7,786,667 B2* | 8/2010 | Yamakawa | H01L 27/3211 313/500 |
| 7,867,797 B2* | 1/2011 | Jo | H01L 21/31058 257/59 |
| 8,927,975 B2* | 1/2015 | Takeuchi | H01L 51/5088 257/40 |
| 2002/0074936 A1* | 6/2002 | Yamazaki | H01L 27/3246 313/504 |
| 2003/0107314 A1* | 6/2003 | Urabe | H01L 27/322 313/506 |
| 2004/0021413 A1* | 2/2004 | Ito | H01L 27/3246 313/504 |
| 2004/0113550 A1 | 6/2004 | Adachi et al. | |
| 2004/0119419 A1* | 6/2004 | Kai | H01L 27/3246 315/169.3 |
| 2005/0218792 A1* | 10/2005 | Jianpu | H01L 27/3213 313/502 |
| 2006/0017375 A1* | 1/2006 | Noguchi | H01L 27/3246 313/504 |
| 2007/0085472 A1* | 4/2007 | Yamakawa | H01L 27/3211 313/504 |
| 2008/0044935 A1* | 2/2008 | Shyu | G02F 1/1368 438/30 |
| 2011/0180821 A1* | 7/2011 | Matsushima | H01L 27/3246 257/88 |
| 2011/0198624 A1* | 8/2011 | Matsushima | H01L 27/3246 257/88 |
| 2012/0080694 A1* | 4/2012 | Yoshida | H01L 27/3211 257/89 |
| 2012/0313123 A1 | 12/2012 | Kim | |
| 2013/0320388 A1 | 12/2013 | Sekimoto | |
| 2014/0042396 A1* | 2/2014 | Yang | H01L 51/5281 257/40 |
| 2016/0284776 A1 | 9/2016 | Kim | |

FOREIGN PATENT DOCUMENTS

| | | |
|---|---|---|
| JP | 2007317606 A | 12/2007 |
| KR | 20070050330 A | 5/2007 |
| KR | 20090028513 A | 3/2009 |
| KR | 20160114754 A | 10/2016 |
| WO | 2017111223 A1 | 6/2017 |

OTHER PUBLICATIONS

Summary of Search Report issued by European Patent Office.
Office Action from the Korean Intellectual Property Office of Korean patent application No. 10-2018-0115705 dated Aug. 30, 2019.
English translation of the Office Action from the Korean Intellectual Property Office of Korean patent application No. 10-2018-0115705 dated Aug. 30, 2019.
Office Action from the Taiwan Intellectual Property Office of Taiwan patent application No. 107136784 dated Jul. 30, 2019.
English abstract translation of Office Action from the Taiwan Intellectual Property Office of Taiwan patent application No. 107136784 dated Jul. 30, 2019.
English abstract translation KR20090028513A.
English abstract translation KR20160114754A.
English abstract translation JP2007317606A.
English abstract translation KR20070050330A.
English abstract translation CN101543135A.
English abstract translation CN102612858A.

* cited by examiner

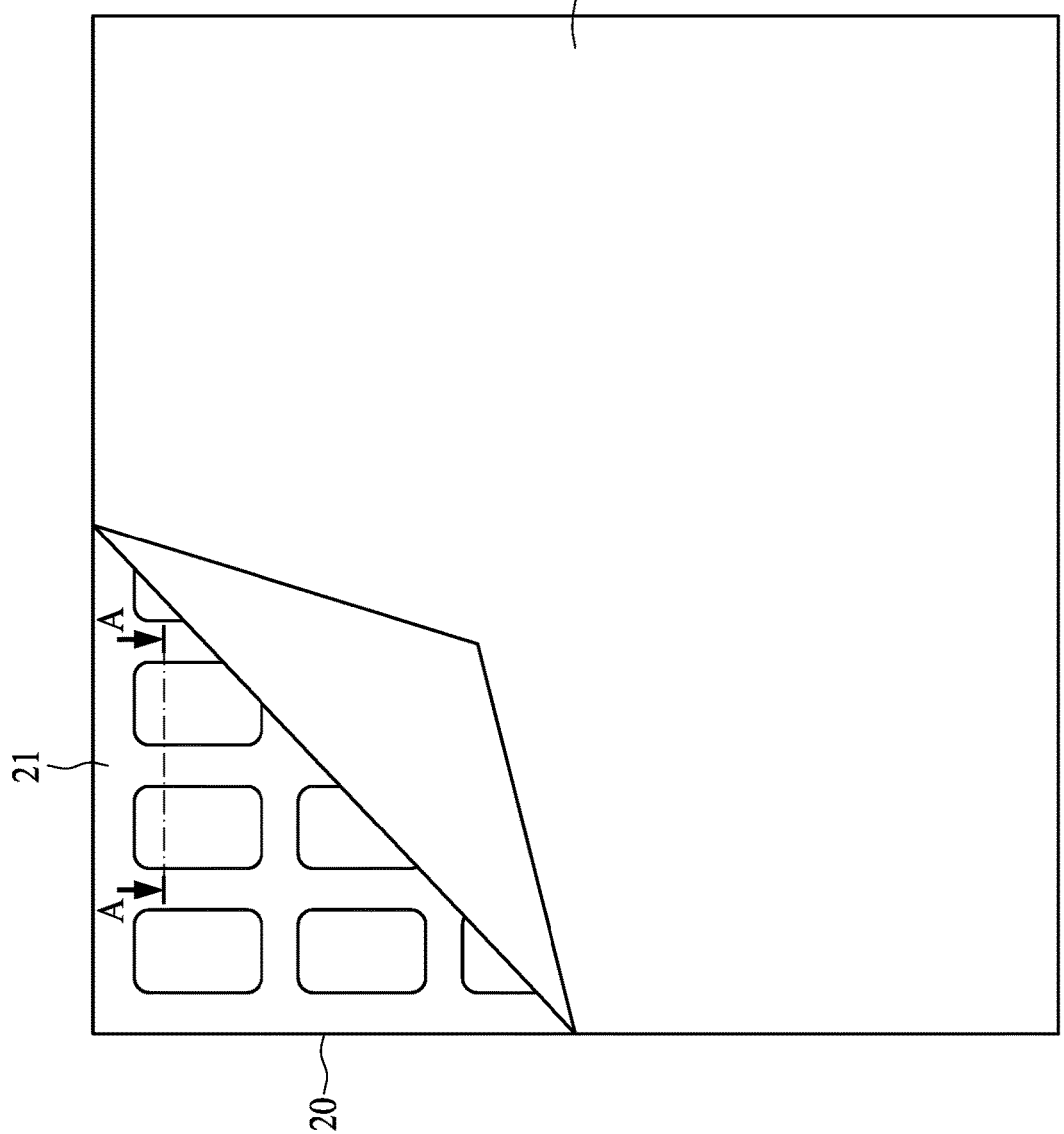

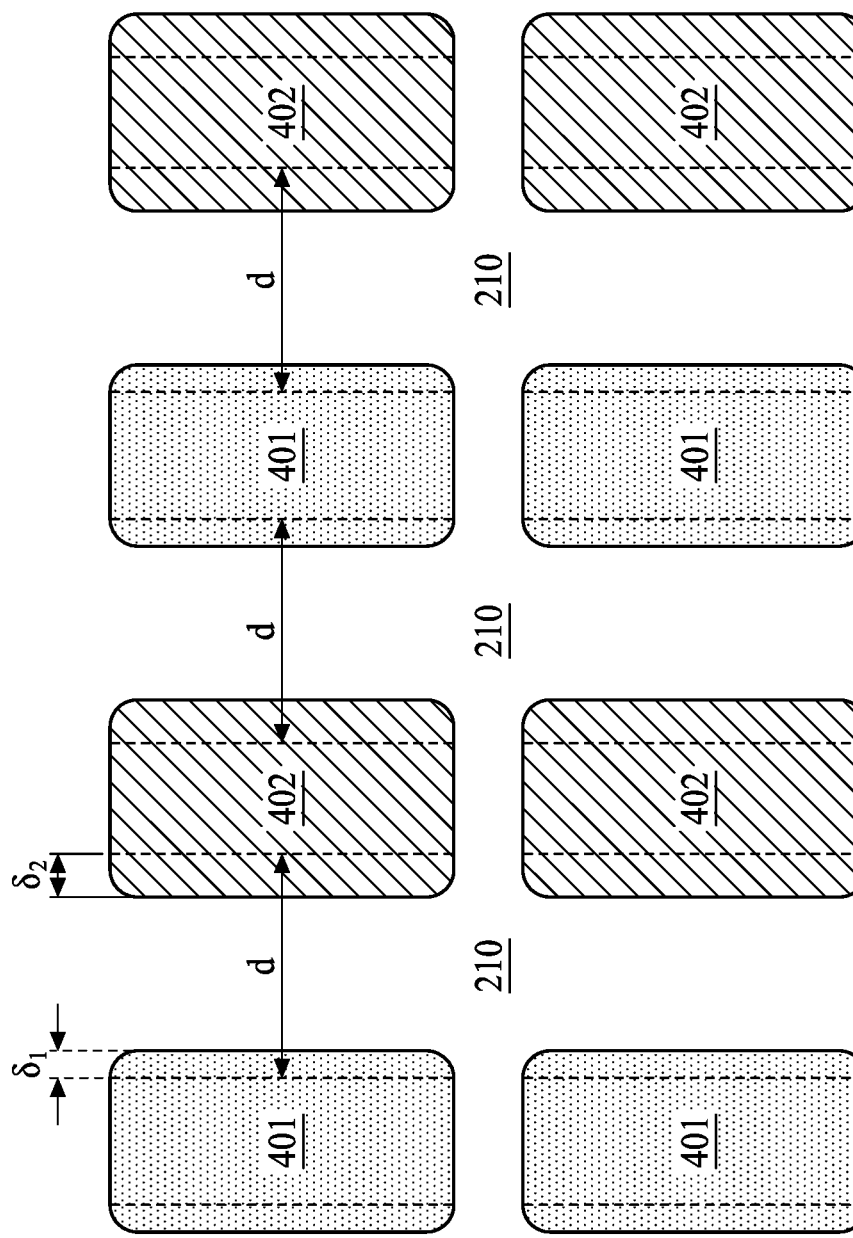

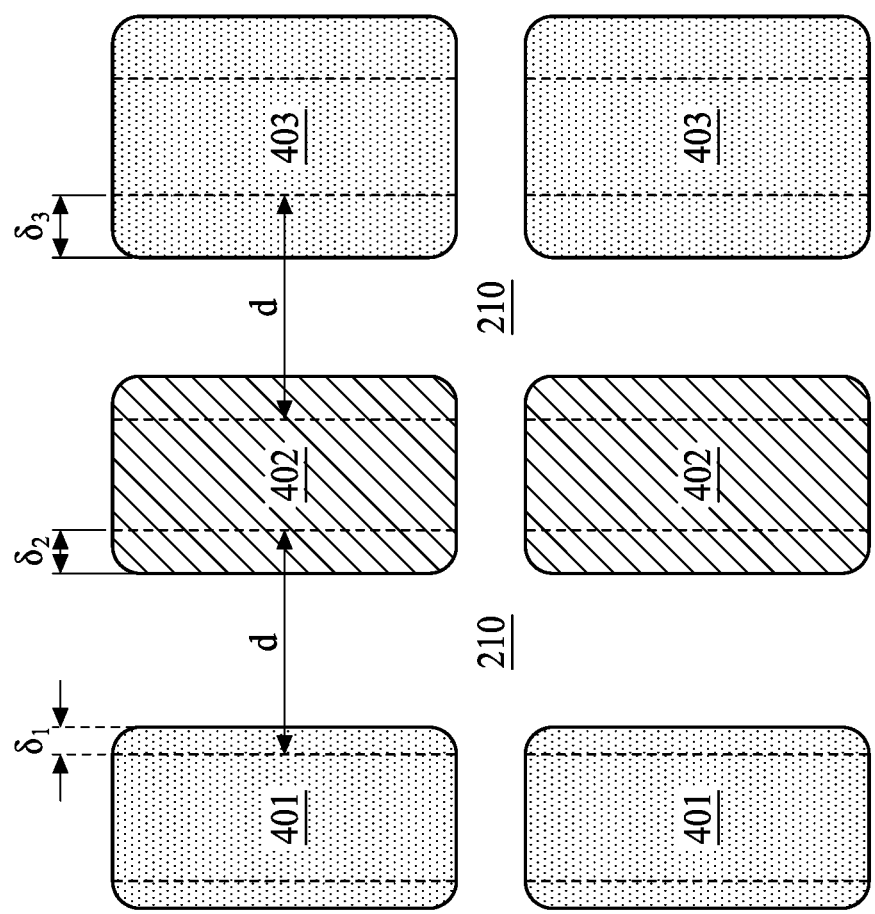

LIGHT EMITTING DEVICE WITH DIFFERENT LIGHT EMITTING MATERIAL OVERLAPPING WIDTH

TECHNICAL FIELD

The present disclosure is related to light emitting device, especially to an organic light emitting device.

BACKGROUND

Organic light emitting display has been used widely in most high end electron devices. However, due to the constraint of current technology, the pixel definition is realized by coating a light emitting material on a substrate through a mask, and often, the critical dimension on the mask cannot be smaller than 100 microns. Therefore, pixel density having 800 ppi or higher becomes a difficult task for a display maker.

SUMMARY

A light emitting device includes a substrate and a light emitting layer over the substrate, the light emitting layer. The light emitting layer has a light emitting pixel array including a plurality of light emitting pixels and a spacer. The spacer is configured to separating the plurality of light emitting pixels. Each light emitting pixel has a light emitting material and an electrode between the light emitting material and the substrate. The spacer has a bump having a curved surface extruding away from the substrate, and the bump covers a peripheral region of the electrode.

In some embodiments, the bump includes fluorine having a greatest concentration in a region proximal to the curved surface. In some embodiments, an angle between the curved surface and the electrode is between about 35 degrees and 55 degrees. In some embodiments, the bump has a thickness being about 1.5 to 2 times greater than a total thickness of the electrode. In some embodiments, the light emitting material lines along the bump and partially covers the curved surface. In some embodiments, the light emitting device further has a second electrode covering the light emitting material and the bump. In some embodiments, the electrode includes a conductive film and a transparent conductive film, and the transparent conductive film covers a sidewall of the conductive film.

In some embodiments, the bump is between a first type light emitting pixel and a second type light emitting pixel emitting a different wavelength spectrum than that of the first type light emitting pixel, wherein a width of the light emitting material overlapping the bump for the first type light emitting pixel is different from a width of the light emitting material overlapping the bump for the second type light emitting pixel.

In some embodiments, a difference of the overlap width between the first type light emitting pixel and the second type light emitting pixel is about 0.1% to about 60% of the width of the first type light emitting pixel. In some embodiments, the light emitting material overlaps the bump with a width being about 75% to about 90% of the half-way width of the bump. In some embodiments, the curved surface has an inflection point. In some embodiments, the inflection point is proximal to a meeting point between the bump and the electrode.

A light emitting device has a substrate and a light emitting array disposed over the substrate. The light emitting array includes a plurality of light emitting pixels and a spacer bump configured to be between two adjacent electrodes of the plurality of light emitting pixels. The spacer bump has a curved surface with two ends respectively intersecting with the two adjacent electrodes, and the spacer bump asymmetrically lands on the adjacent electrodes. In some embodiments, a transparent conductive film is under the spacer bump and between the two adjacent electrodes. In some embodiments, the spacer bump is a photo sensitive material. In some embodiments, each of the two adjacent electrodes is under a corresponding light emitting material; each corresponding light emitting material covers a portion of the curved surface with an overlap width different than the other. In some embodiments, each of the two adjacent electrodes is under a corresponding second electrode, and the two second electrodes are physically disconnected.

BRIEF DESCRIPTION OF THE DRAWINGS

FIG. 1 is a top view illustrating an intermediate product of a light emitting device.

FIG. 4A is a top view of a portion of the light emitting layer having several light emitting pixels.

FIG. 4B is a top view of a portion of the light emitting layer having several light emitting pixels.

DETAILED DESCRIPTION OF THE DISCLOSURE

Figure 2A:
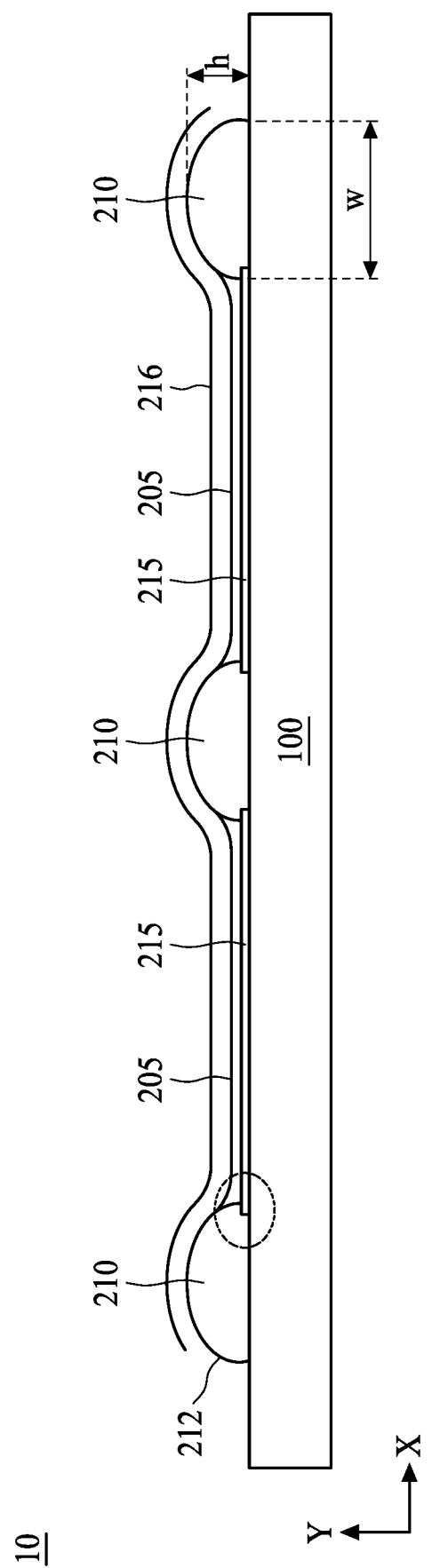
FIG. 2A is a cross sectional view along line AA in FIG. 1.

FIG. 1 is a top view illustrating an intermediate product of a light emitting device 10. The light emitting device 10 has a light emitting layer 20 and a cap layer 40 over the light emitting layer 20. For the light emitting layer 20, a spacer 21 can be designed to provide an array of recesses for accommodating an array of light emitting pixels. In some embodiments, the spacer 210 may include a photo sensitive material.

FIG. 2A is a cross sectional view along line AA in FIG. 1 and only illustrating the light emitting area. The cap layer 40 is omitted herein for simplicity. The spacer 21 has several bumps 210 to define the light emitting pixel pattern. A recess is between two adjacent bumps 210 and provides the space to accommodate a light emitting pixel. People in the art should appreciate that the bumps 210 are shown in a disconnected manner from the cross sectional view, but they may be connected with each other through other portions of the spacer 21 from the top view perspective as shown in FIG. 1.

A substrate 100 is under the light emitting layer 20. In some embodiments, the substrate may include a transistor array that is arranged in correspondence with the light emitting pixels in the light emitting layer 20. The substrate 100 may include several capacitors. In some embodiments, there are more than one transistors are configured to form a circuit with one capacitor and one light emitting pixel.

In some embodiments, the substrate 100 is a stack including at least three different layers. The substrate 100 may have an inorganic dielectric layer at the bottom and a metallic layer on the inorganic dielectric layer. Another inorganic dielectric is disposed over the metallic layer. The metallic layer is sandwiched by two inorganic dielectric layers. In some embodiments, the inorganic dielectric layer can be replaced by an organic dielectric layer with a bending radius less than about 100 um. In some embodiments, the inorganic dielectric has a thickness between about 400 um and 1200 um. The metallic layer has a thickness between about 100 um and 400 um. In some embodiments, the substrate 100 includes two polymeric layers and an inorganic layer between the two polymeric layers.

In some embodiments, the substrate 100 has two polymeric layers and a metallic layer there between. In some embodiments, the substrate 100 has two polymeric layers and an inorganic layer there between. The inorganic layer can be oxide, nitride. In some embodiments, the inorganic layer includes silicon oxide, or silicon nitride, or alumioxide. In some embodiments, the inorganic layer has higher water resistance than the polymeric layer. In some embodiments, at least one side (along the film stacking direction) of the polymeric layer is coated with an inorganic layer. In some embodiments, the polymeric layer has a thickness between about 1 um and about 5 um. In some embodiments, the substrate 100 is partially formed by a black material. The black material can absorb the visible light in order to reduce the reflection.

A light emitting pixel has a first electrode 215 over the substrate 100. For some examples, the first electrode is the anode of the light emitting pixel. The first electrode 215 is partially covered by the spacer 21. As in FIG. 2A, the peripheral region of the first electrode 215 is covered by bumps 210. In some embodiments, the edge corner of the electrode 215 is entirely enclosed by the spacer bump 210. In some embodiments, the sidewall of the first electrode 215 is entirely in contact with the spacer bump 210.

The first electrode 215 may have a total thickness from about 1500 A to about 2700 Å. In some embodiments, the first electrode 215 has a total thickness from about 1800 Å to about 2200 Å. In some embodiments, the first electrode 215 has a total thickness about 2000 Å. The first electrode 215 may include ITO, IZO, AlCu alloy, AgMo Alloy, about 50 Å to 500 Å ITO (or IZO) and 500 Å to 2000 Å metallic film (Ag, Al, Mg, Au) and about 50 Å to 1000 Å ITO (or IZO).

A second electrode 216 is over the light emitting material 205. In some cases, the second electrode 216 is patterned to only cover the effective light emitting area of each light emitting pixel. In some cases, the second electrode 216 is in contact with the light emitting material 205. The second electrode 216 may be a continuous film as shown in FIG. 2A and lining over the light emitting material 205 and the spacer bumps 210. In other words, the second electrode 216 is a common electrode for several light emitting pixels. In some cases, the second electrode 216 is a common electrode for all light emitting pixels in the light emitting layer 20.

The second electrode 216 may have a thickness from about 80 Å to about 500 Å. In some embodiments, the second electrode 216 may have a thickness from about 80 Å to about 150 Å. In some embodiments, the second electrode 216 may have a thickness from about 150 Å to about 200 Å. In some embodiments, the second electrode 216 may have a thickness from about 200 Å to about 300 Å. In some embodiments, the second electrode 216 may have a thickness from about 300 Å to about 400 Å. In some embodiments, the second electrode 216 may have a thickness from about 400 Å to about 500 Å. In some embodiments, the second electrode 216 is a composite structure. For example, the second electrode 216 has a conductive film and a transparent conductive film thereon. The conductive film is located between a transparent conductive film and the light emitting material 205. In some embodiments, the conductive film includes aluminum, gold, silver, copper, magnesium, molybdenum etc. In some embodiments, the transparent conductive film includes indium, tin, graphene, zinc, oxygen, etc. In some embodiments, the transparent conductive film is ITO (indium tin oxide). In some embodiments, the transparent conductive film is IZO (indium zinc oxide). In some embodiments, the transparent conductive film is between the conductive film and the light emitting material 205.

A light emitting material 205 is disposed between the first electrode 215 and the second electrode 216. In some embodiments, the light emitting material 205 includes organic light emitting material. In some embodiments, the light emitting material 205 is a composite film structure having several thin films stacked along the vertical direction (Y axis). The light emitting material 205 may have several carrier transportation or injection films. The light emitting material 205 may have an emitting layer (EL). The carrier can be hole or electron.

Figure 2B:
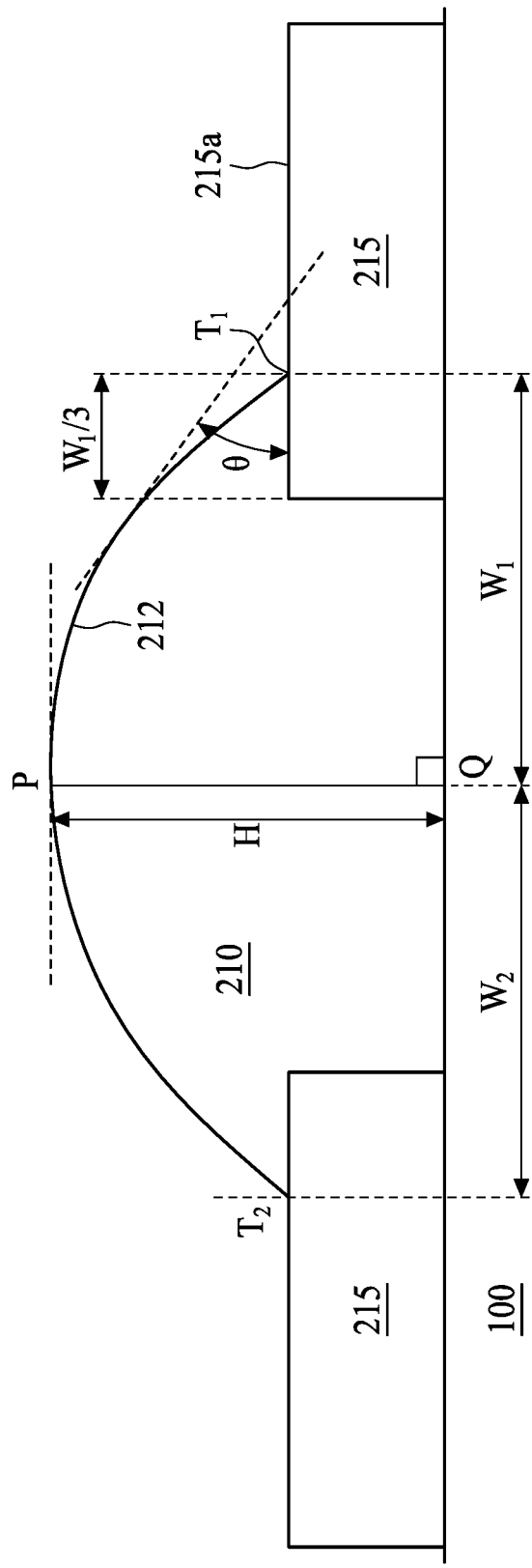
FIG. 2B illustrates a spacer bump that lands on two adjacent first electrodes.

In some embodiments, the spacer bump 210 has a curved surface 212 protruding away from the substrate 100 and a portion of the light emitting material 205 (please refer to dotted circle) is disposed over the curved surface 212. FIG. 2B illustrates a spacer bump 210 that lands on two adjacent first electrodes 215. The bump 210 has a peak P and the thickness H of the bump is the greatest at the peak P. In the present disclosure, the thickness is measured along Y axis. For the spacer bump 210, the thickness is measured from the interface (or point Q) between the substrate 100 and the spacer bump 210. In some embodiments, the thickness H of the spacer bump 210 at peak P is from about 7000 Å to about 10000 Å. In some embodiments, the thickness H is from about 7000 Å to about 8000 Å. In some embodiments, the thickness H of the spacer bump 210 at peak P is from about 8000 Å to about 9000 Å. In some embodiments, the thickness H of the spacer bump 210 at peak P is from about 9000 Å to about 10000 Å. H is the shortest distance between peak P and point Q. In some embodiments, the thickness H is about 1.5 to 2 times greater than the total thickness of the first electrode 215.

Line PQ is a midway line of the bump 210. A point $T_x$ is where the curved surface 212 meets the first electrode 215. $T_1$ is the right side meeting point and $T_2$ is for the left side. $W_1$ is the distance between meeting point $T_1$ and line PQ, and $W_2$ is the distance between meeting point $T_2$ and line PQ. In some embodiments, $W_1$ is from about 0.8 um to about 1.6 um. In some embodiments, $W_1$ is from about 0.8 um to about 1.0 um. In some embodiments, $W_1$ is from about 1.0 um to about 1.2 um. In some embodiments, $W_1$ is from about 1.2 um to about 1.4 um. In some embodiments, $W_1$ is from about 1.4 um to about 1.6 um. In some embodiments, $W_1$ is substantially equal to $W_2$. In some embodiments, the difference between $W_1$ and $W_2$ is greater than 8%, i.e. the bump 210 is asymmetrically landed on the adjacent first electrodes.

Another feature of the bump 210 is the angle θ between the curved surface 212 and the first electrode 215. To measure the angle θ, firstly, draw a tangent line to the curve 212 at a point that is ⅓ $W_1$ from the meeting point $T_1$. The tangent line is extended to be intersected with a surface 215a of the first electrode 215. θ is the angle between the tangent line and the surface 215a. In some embodiments, the angle is between about 35 and 55. In some embodiments, the angle is between about 35 and 45. In some embodiments, the angle is between about 40 and 45. In some embodiments, the angle is between about 45 and 50. In some embodiments, the angle is between about 50 and 55. In some embodiments, the angle is between about 40 and 55.

In some embodiments, the spacer 210 may have fluorine (F). In the spacer 210, a region proximal to the curved surface 212 has a greater F concentration than other regions. In some embodiments, some metal oxide particulates can be added into the spacer 210. The particulates can be used to scatter the light emitted from the light emitting material 205.

Figure 2C:
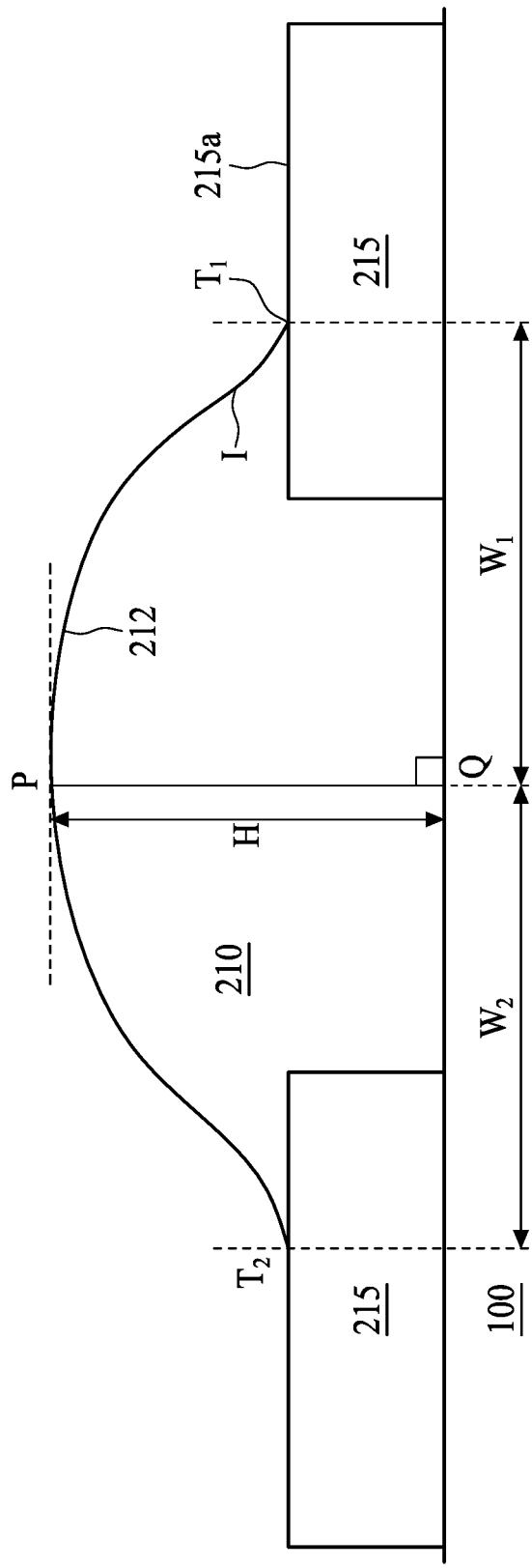
FIG. 2C is another embodiment of a spacer bump.

FIG. 2C is another embodiment of a spacer bump 210. The curved surface 212 has an inflection point I proximal to the meeting point $T_1$. The curved surface 212 protrudes away from the substrate 100 between point P and point I. After the inflection point I, the curved surface 212 recesses toward the substrate 100. In some embodiments, the inflection point I is located about ⅙ $W_1$ from the meeting point $T_1$. In some embodiments, the inflection point I is located about ⅐ $W_1$ from the meeting point $T_1$. In some embodiments, the inflection point I is located about ⅛ $W_1$ from the meeting point $T_1$.

Figure 3:
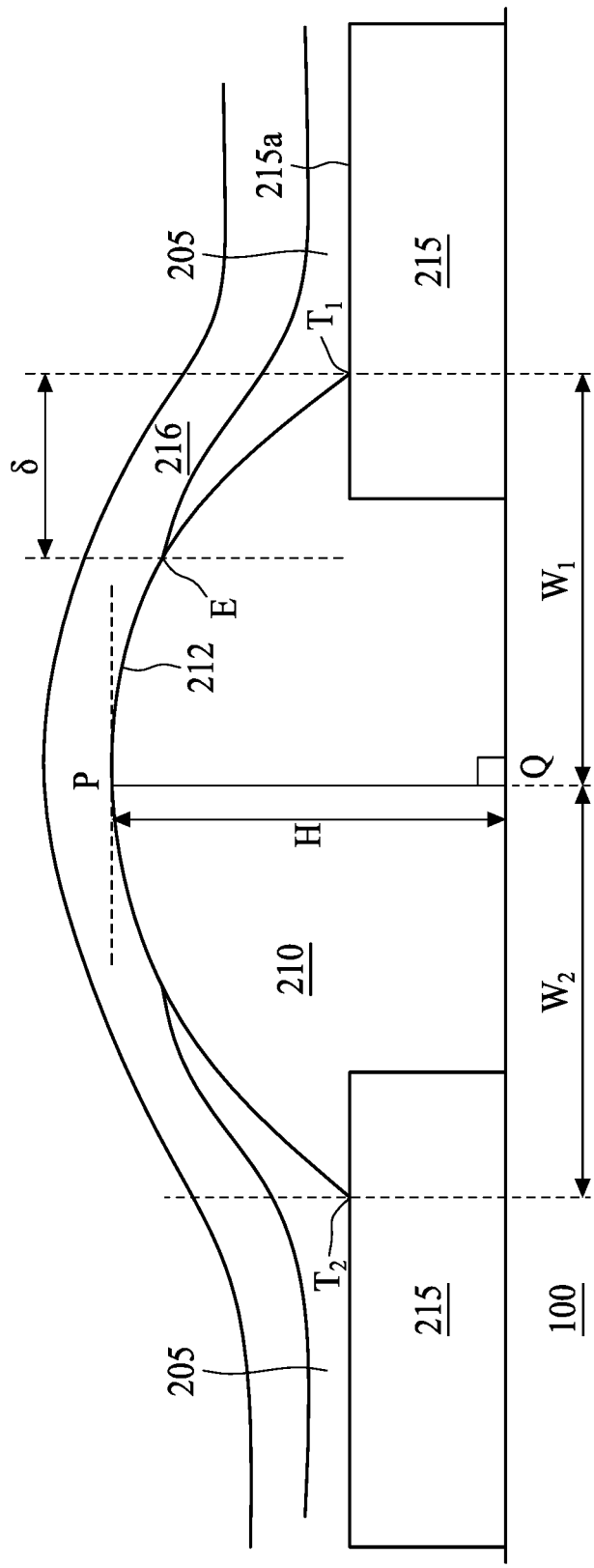
FIG. 3 is a cross sectional view of one embodiment.
Figure 5:
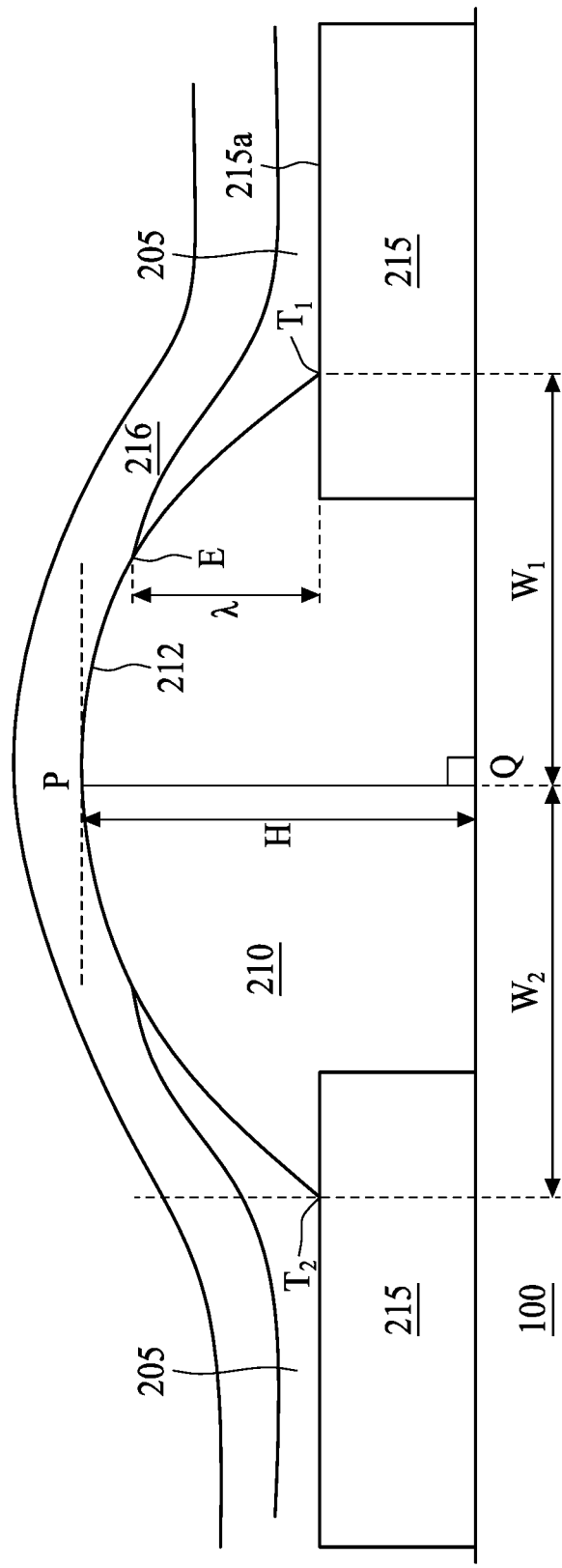
FIG. 5 is a cross sectional view of one embodiment.

Referring to FIG. 3, the light emitting material 205 is continuously lining along the first electrode 215 and further extended to partially cover the curved surface 212 then ends at a point E. In other words, the point E is a point where the spacer bump 210, the second electrode 216, and the light emitting material 205 meet.

The light emitting material 205 has a portion overlapped with the first electrode 215. In some embodiments, the portion is also called effective illumination area. In some embodiments, the effective illumination area has a width at least under 10 um. In some embodiments, the effective illumination area has a width from about 3 um to 6 um. In some embodiments, the effective illumination area has a width from about 4 um to 6 um. The effective illumination area determines the pixel size of the light emitting device 10 in FIG. 1. Because the size of the effective illumination area can be controlled under 10 um, the pixel density of the light emitting device 10 can be over 1000 or 2000 ppi.

The horizontal distance δ is the distance from the meeting point $T_1$ to the end point E along the X axis. The horizontal distance δ indicates how the light emitting material 205 overlaps the bump 210. The horizontal distance δ is also called overlap width. In some embodiments, the overlap width δ is about 80-85% of $W_1$. In some embodiments, the overlap width δ is about 75-80% of $W_1$. In some embodiments, the overlap width δ is about 75-90% of $W_1$. In some embodiments, the overlap width δ is from about 0.85 um to 1.0 um. In some embodiments, the overlap width δ is from about 0.8 um to 0.9 um. In some embodiments, the overlap width δ is from about 0.9 um to 1.0 um.

In some embodiments, there are at least two different types of light emitting pixel in the light emitting device 10. The first type pixel emits a light having a first wavelength spectrum, and the second type pixel emits a light having a second wavelength spectrum which is different from the first wavelength spectrum. In some embodiments, the first type pixel has a greater overlap width than that of the second type pixel. In some embodiments the overlap width of the first type pixel is about 0.1% greater than that of the second type pixel. In some embodiments the overlap width of the first type pixel is about 60% greater than that of the second type pixel. In some embodiments the overlap width of the first type pixel is from about 0.1% to about 60% greater than that of the second type pixel.

FIG. 4A is a top view of a portion of the light emitting layer 20 having several light emitting pixels. The first type pixel is 401 and the second type pixel is 402. The dotted lines represent where the light emitting material of each pixel meets the spacer bump 210. The dotted lines in FIG. 4A are the points $T_1$ or $T_2$ in FIG. 3. Spacing d is the width of the spacer bump 210 in FIG. 3, i.e. $d=W_1+W_2$. All the spacer bump have a substantially width, however, the overlap width is different. The overlap width of the first type pixel is $δ_1$ and the second type pixel is $δ_2$; $δ_1$ is smaller than $δ_2$. Therefore, though the spacer bumps in the light emitting layer 20 may have a uniform width, the adjacent pixels have different overlap width if they are in different types (emitting different wavelength spectrum).

FIG. 4B is a top view of a portion of the light emitting layer 20 having several light emitting pixels. The first type pixel is 401, the second type pixel is 402, and the third type pixel is 403. The dotted lines represent where the light emitting material of each pixel meets the spacer bump 210. The dotted lines in FIG. 4B are the points $T_1$ or $T_2$ in FIG. 3. Spacing d is the width of the spacer bump 210 in FIG. 3, i.e. $d=W_1+W_2$. All the spacer bump have a substantially width, however, the overlap width is different. The overlap width of the first type pixel is $δ_1$, the overlap width of the second type pixel is $δ_2$, and the overlap width of the third type pixel is $δ_3$, $δ_1$ is smaller than $δ_2$, and $δ_2$ is smaller than $δ_3$. Similar to FIG. 4A, the spacer bumps in the light emitting layer 20 have a uniform width, but the adjacent pixels have different overlap width if they are in different types (emitting different wavelength spectrum). In some embodiments, $δ_1$ is about 0.1% to about 60% smaller than $δ_2$, and $δ_2$ is about 0.1% to about 60% smaller than $δ_3$.

A vertical distance λ is the distance from the meeting point $T_1$ to the end point E measured along the Y axis. The vertical distance λ can also be used to indicate how the light emitting material 205 overlaps or covers the bump 210. The vertical distance λ is also called overlap height. In some embodiments, the overlap height λ is about 60-80% of H. In some embodiments, the overlap height λ is about 60-75% of H. In some embodiments, the overlap height λ is about 65-75% of H. In some embodiments, the overlap height λ is about 70-80% of H. In some embodiments, the overlap height λ is about 70-75% of H. In some embodiments, the overlap height λ is about 75-80% of H.

In some embodiments, the overlap height λ is from about 0.6 um to 0.8 um. In some embodiments, the overlap height λ is from about 0.65 um to 0.7 um. In some embodiments, the overlap height λ is from about 0.7 um to 0.75 um. In some embodiments, the overlap height λ is from about 0.75 um to 0.8 um.

In some embodiments, the first type pixel has a greater overlap height than that of the second type pixel. In some embodiments the overlap height of the first type pixel is about 20% to about 50% greater than that of the second type pixel. In some embodiments, the first type pixel has a greater overlap height than that of the second type pixel, and the second type pixel has a greater overlap height than that of the third type pixel. In some embodiments the overlap height of the first type pixel is about 20% to about 50% greater than that of the second type pixel. In some embodiments the overlap height of the second type pixel is about 20% to about 50% greater than that of the third type pixel.

In some cases, the light emitting material 205 is in contact with the curved surface 212. The portion of the light emitting material 205 in contact with the curved surface 212 is conformal to the curved surface 212.

Figure 6A:
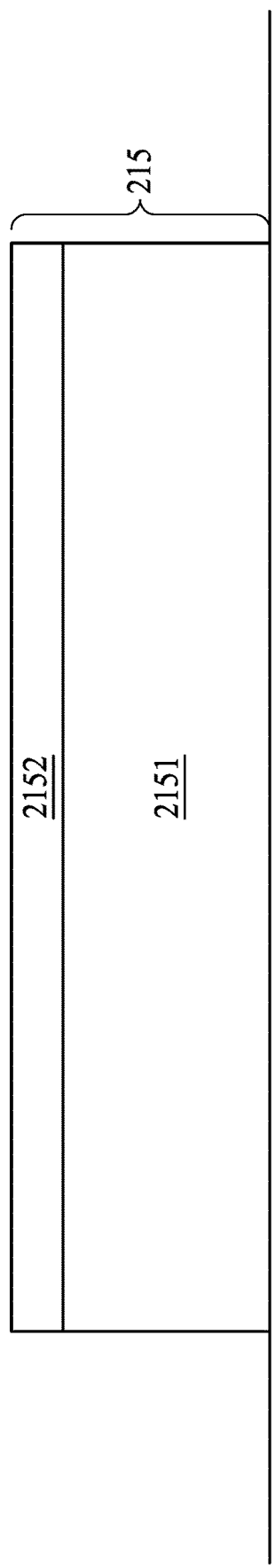
FIG. 6A is a cross sectional view of an electrode.

In some embodiments, the electrode 215 is a composite structure. For example, the electrode 215 has a conductive film and a transparent conductive film thereon. FIG. 6A is an example of the electrode 215. There is a conductive film 2151 located between a transparent conductive film 2152 and the substrate 100. In some embodiments, the conductive film 2151 includes aluminum, gold, silver, copper, etc. In some embodiments, the transparent conductive film 2152 includes indium, tin, graphene, zinc, oxygen, etc. In some embodiments, the transparent conductive film 2152 is ITO (indium tin oxide). In some embodiments, the transparent conductive film 2152 is IZO (indium zinc oxide). The metallic film 2151 may have a thickness between about 1500 Å and about 3000 Å. The transparent conductive film 2152 may have a thickness from about 80 Å to about 1000 Å.

Figure 6B:
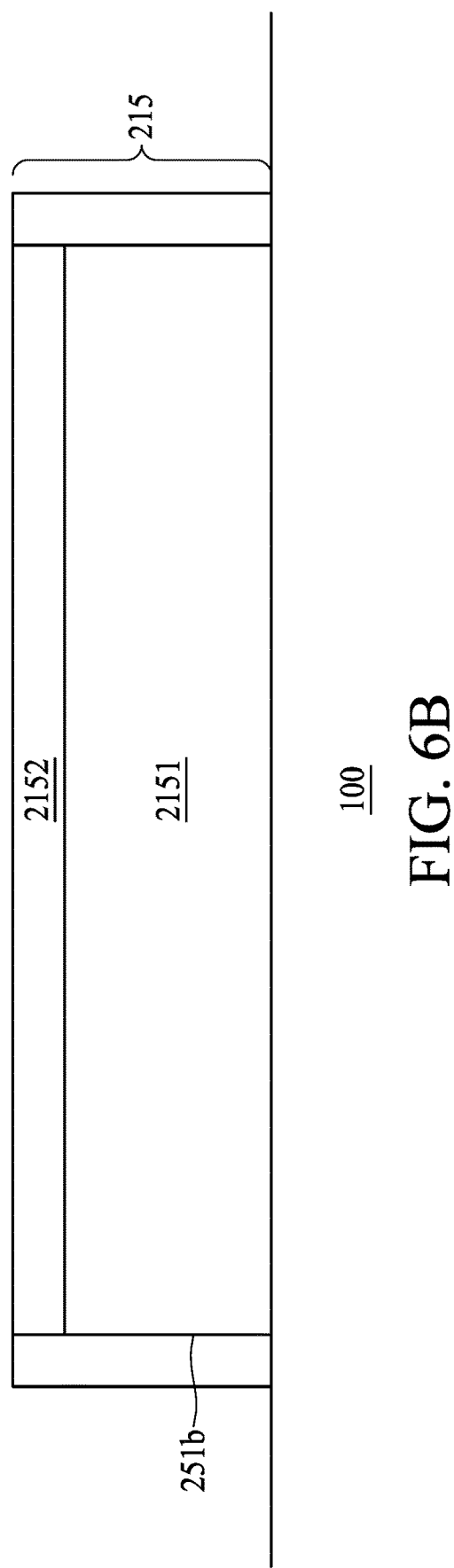
FIG. 6B is a cross sectional view of an electrode.
Figure 6C:
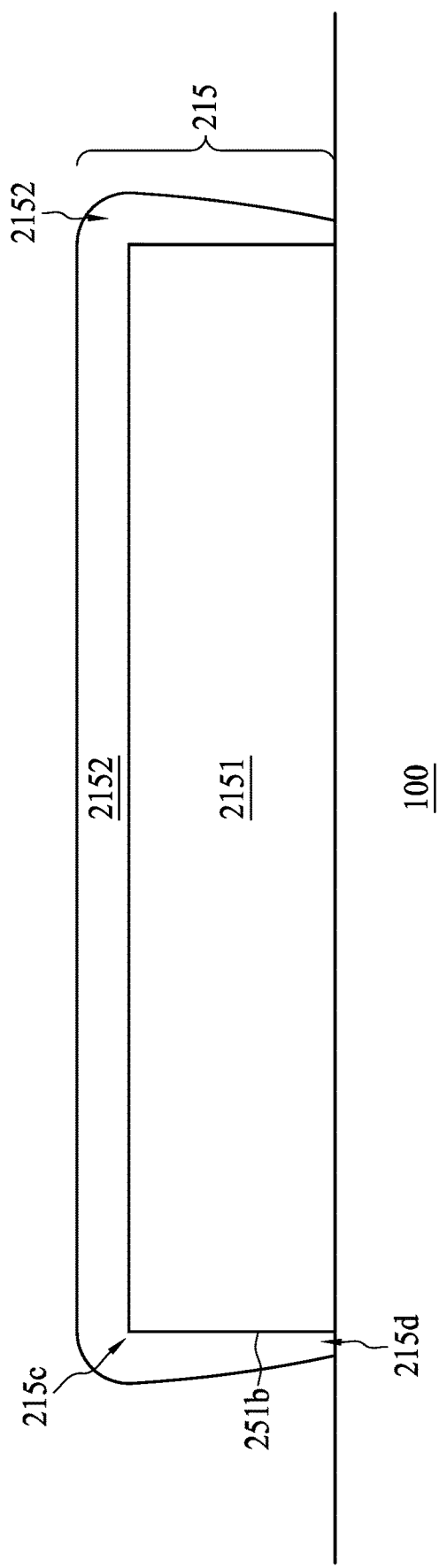
FIG. 6C is a cross sectional view of an electrode.

In some embodiments, the transparent conductive film 2152 is further extended to cover the sidewall 215b of the conductive layer 2151 as shown in FIG. 6B. In some embodiments, along the sidewall 215b, the transparent conductive film 2152 has a greatest thickness at the topmost portion 215c of the sidewall 215b and lowest at the bottom most portion 215d (where the transparent conductive film 2152 meets the substrate 100) of the sidewall as shown in FIG. 6C. In some embodiments, the thickness of the transparent conductive film 2152 increases gradiently with respect to the vertical distance between the transparent conductive film 2152 and the substrate 100.

Figure 7A:
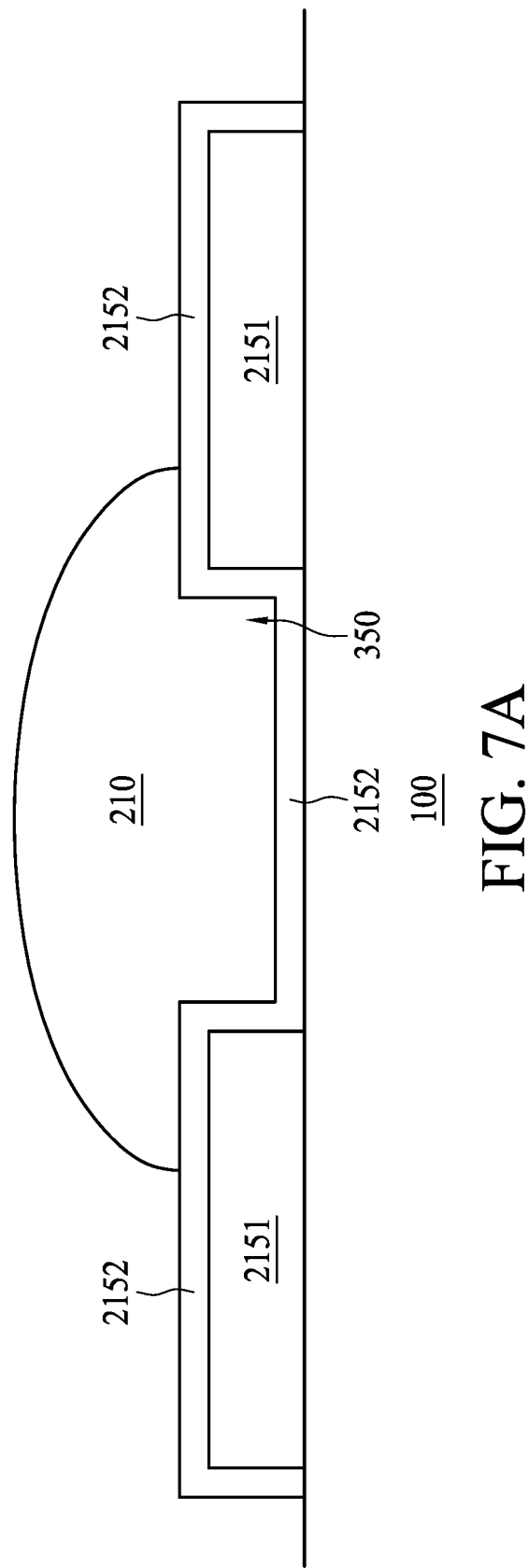
FIG. 7A is a cross sectional view of one embodiment.
Figure 7B:
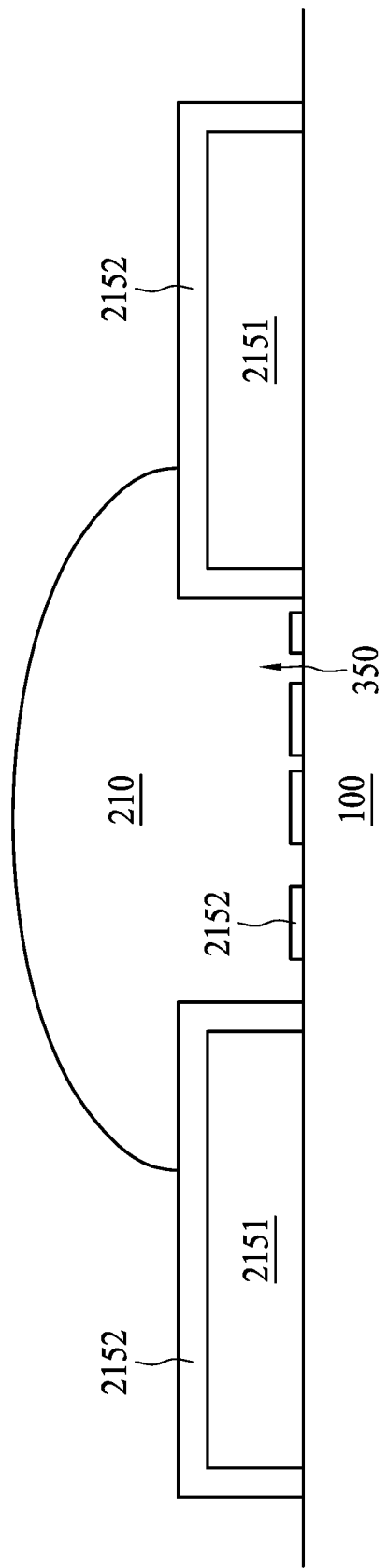
FIG. 7B is a cross sectional view of one embodiment.

In some embodiments, the transparent conductive film 2152 is further extended to a valley 350 between two adjacent but separated conductive layers as shown in FIG. 7A. The valley is filled with the spacer bump 210. In the valley 350, the transparent conductive film 2152 is in contact with the substrate 100 at one side and in contact with the spacer bump 210 at the opposite side. Conductive film is entirely removed from the valley 350. The transparent conductive film 2152 may be continuous or broken into several segments lining between the spacer bump 210 and the substrate 100. FIG. 7B shows In some embodiments, transparent conductive film 2152 is broken into several segments randomly distributed over the substrate. In some embodiments, the average thickness of the transparent conductive film 2152 in the valley 350 is from about ¼ to about ½ of the thickness of the transparent conductive film layer 2152 above the conductive layer 2151.

In some embodiments, the first electrode 215 has at at three different films. A conductive film, such as Al, Cu, Ag, Au, etc., is sandwiched by two transparent conductive film. In some cases, one of the two transparent conductive films is an ITO, which is in contact with the substrate 100 at one side and in contact with the conductive film at the other side. In some cases, one of the two transparent conductive films is an ITO, which is in contact with the conductive film at one side and in contact with the spacer bump 210 or the light emitting material 205 at the other side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A light emitting device, comprising:
   a substrate;
   a plurality of light emitting pixels, including a first type light emitting pixel and a second type light emitting pixel emitting different wavelength spectrums, wherein each of the plurality of light emitting pixels includes a light emitting material and an electrode between the light emitting material and the substrate; and
   a spacer bump disposed between the plurality of light emitting pixels and configured to separate the plurality of light emitting pixels, wherein the spacer bump has a curved surface extruding away from the substrate and covers a peripheral region of the electrode,
   wherein the first type light emitting pixel overlaps the spacer bump on two opposite sides of the first type light emitting pixel, and a first overlap width and a second overlap width of the two opposite sides respectively of the first type light emitting pixel on the spacer bump measured along an axis are substantially equal,
   wherein the second type light emitting pixel adjacent to the first type light emitting pixel overlaps the spacer bump on a side of the second type light emitting pixel facing the first type light emitting pixel, and a third overlap width of the second type light emitting pixel on the spacer bump measured along the axis is different from the first overlap width and the second overlap width of the first type light emitting pixel, and
   wherein a difference of the first overlap width and the third overlap width is about 0.1% to about 60% of a width of the first type light emitting pixel.

2. The light emitting device in claim 1, wherein the spacer bump includes fluorine having a greatest concentration in a region proximal to the curved surface.

3. The light emitting device in claim 1, wherein an angle between the curved surface and the electrode is between about 35 degrees and 55 degrees.

4. The light emitting device in claim 1, wherein the spacer bump has a thickness being about 1.5 to 2 times greater than a total thickness of the electrode.

5. The light emitting device in claim 1, wherein the light emitting material lines along the spacer bump and partially covers the curved surface.

6. The light emitting device in claim 1, further comprising a top electrode covering the light emitting material and the spacer bump.

7. The light emitting device in claim 6, wherein a thickness of the electrode is greater than a thickness of the top electrode.

8. The light emitting device in claim 7, wherein the thickness of the electrode is in a range of 1500 to 2700 angstroms, and the thickness of the top electrode is in a range of 80 to 500 angstroms.

9. The light emitting device in claim 1, wherein the electrode includes a conductive film and a transparent conductive film, and the transparent conductive film covers a sidewall of the conductive film.

10. The light emitting device in claim 1, wherein the light emitting material overlaps the spacer bump with a width being about 75% to about 90% of the half-way width of the spacer bump.

11. The light emitting device in claim 1, wherein the curved surface has an inflection point.

12. The light emitting device in claim 11, wherein the inflection point is proximal to a meeting point between the spacer bump and the electrode.

13. A light emitting device, comprising:
a substrate;
a light emitting array disposed over the substrate, the light emitting array comprising a plurality of light emitting pixels; and
a spacer bump configured to be between two adjacent electrodes of the plurality of light emitting pixels,
wherein the spacer bump has a curved surface with two ends respectively intersecting with the two adjacent electrodes from a cross-sectional perspective,
wherein the spacer bump asymmetrically lands on the two adjacent electrodes from the cross-sectional perspective,
wherein a first end of the two ends of the spacer bump overlapping with a first light emitting pixel of the plurality of light emitting pixels is substantially parallel with a second end of the two ends of the spacer bump overlapping with a second light emitting pixel adjacent to the first light emitting pixel of the plurality of light emitting pixels from a top view perspective, and
wherein the two adjacent electrodes are under a first light emitting material and a second light emitting material respectively, the first light emitting material covers the curved surface from the first end with a first overlap width, the second light emitting material covers the curved surface from the second end with a second overlap width, and a difference of the first overlap width and the second overlap width is about 0.1% to about 60% of a width of the first light emitting pixel.

14. The light emitting device in claim 13, further comprising a transparent conductive film under the spacer bump and between the two adjacent electrodes.

15. The light emitting device in claim 13, wherein the spacer bump is a photo sensitive material.

16. The light emitting device in claim 13, wherein the substrate comprises an inorganic dielectric layer and a metallic layer on the inorganic dielectric layer.

17. The light emitting device in claim 16, further comprising:
a conductive film, covering a top and sidewalls of each of the two adjacent electrodes of the plurality of light emitting pixels.

18. The light emitting device in claim 17, wherein the conductive film includes a plurality of segments covering at least portions of the substrate between the two adjacent electrodes of the plurality of light emitting pixels.

* * * * *